(12) United States Patent
Nakano et al.

(10) Patent No.: US 6,680,540 B2
(45) Date of Patent: Jan. 20, 2004

(54) SEMICONDUCTOR DEVICE HAVING COBALT ALLOY FILM WITH BORON

(75) Inventors: Hiroshi Nakano, Hitachi (JP); Takeyuki Itabashi, Hitachi (JP); Haruo Akahoshi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/799,533

(22) Filed: Mar. 7, 2001

(65) Prior Publication Data

US 2001/0030366 A1 Oct. 18, 2001

(30) Foreign Application Priority Data

| Mar. 8, 2000 | (JP) | ..................... 2000-068615 |
| Aug. 30, 2000 | (JP) | ..................... 2000-260977 |
| Feb. 16, 2001 | (JP) | ..................... 2001-040640 |

(51) Int. Cl.$^7$ .............................................. H01L 23/48
(52) U.S. Cl. ...................... 257/758; 257/762; 427/126.6
(58) Field of Search ......................... 438/706; 257/758, 257/762, 763, 764, 211; 427/126.6

(56) References Cited

U.S. PATENT DOCUMENTS

| 5,382,447 A | * | 1/1995 | Kaja et al. | ................ 427/126.6 |
| 5,670,420 A | | 9/1997 | Choi | |
| 5,695,810 A | | 12/1997 | Dubin et al. | |
| 6,083,842 A | * | 7/2000 | Cheung et al. | ............ 438/706 |
| 6,100,184 A | | 8/2000 | Zhao et al. | |
| 6,153,935 A | | 11/2000 | Edelstein et al. | |
| 6,335,104 B1 | | 1/2002 | Sambucetti et al. | |
| 6,342,733 B1 | | 1/2002 | Hu et al. | .................... 257/750 |

FOREIGN PATENT DOCUMENTS

| JP | 1116906 | 5/1989 |
| JP | 6120674 | 4/1994 |
| JP | 9237947 | 9/1997 |
| JP | 049116 | 2/2000 |

OTHER PUBLICATIONS

Zhao et al., "Reliability and Electrical Properties of New Low Dielectric Constant Interleverl Dielectrics for High Performance ULSI Interconnect" IEEE, 34th Annual Proceedings, Reliability Conference, 1996, pp. 156–163.*
Komai et al.—U.S. patent application publication US 2001/0019892 A1, Publication Date: Sep. 6, 2001.
Proceedings of SPIE–Int. Soc., Opt. Eng., 3214(Multi level interconnect technology),pp. 21–32, 1997, S. Lopatin., Y. Shacham–Diamand., P.K. Vasudev.
Proceedings of Electrochemical Society, vol. 97–8,pp. 186–195,1997,S. Lopatin, Y. Shacham–Diamand., P.K. Vasudev.
Coference Proceedings ULSI XIV, Materials Research Society, pp. 103–109, 1999, Y. Shacham–Diamand, Y. Sverdlov.
J. Electrochem Soc., vol. 141, No. 7, 1994, pp. 1843–1850, M. Paunovic, P.J. Bailey, R.G. Schad, D.A. Smith.
IBM, J. Res. Develop., vol. 42, pp. 607–620, 1998, E.J. O'Sullivan, A.G. Schrott, M. Paunovic, C.J. Sambucetti, J.R. Marino, P.J. Bailey, S. Kaja, K.W. Semkow.

* cited by examiner

*Primary Examiner*—W. David Coleman
(74) *Attorney, Agent, or Firm*—Antonelli, Terry, Stout & Kraus, LLP

(57) ABSTRACT

In order to prevent a rise in resistance due to oxidation of copper wiring and diffusion of copper, a semiconductor device is provided which contains a wire protective film 1 covering the top of the copper wiring 2 formed in the insulation film and a barrier film surrounding the side and bottom of the copper wiring. The wire protective film and/or barrier film is formed with a cobalt alloy film containing (1) cobalt, (2) at least one of chromium, molybdenum, tungsten, rhenium, thallium and phosphorus, and (3) boron.

15 Claims, 7 Drawing Sheets

SEMICONDUCTOR DEVICE HAVING COBALT ALLOY FILM WITH BORON

BACKGROUND OF THE INVENTION

The present invention relates to a semiconductor device and method of production thereof; and, more particularly, the invention relates to a semiconductor device which has a wiring structure made of copper, a basic wire protective film around said copper wiring, namely, covering the top of the copper wiring, and a barrier film surrounding the side and bottom of said copper wiring.

Improvement of the operation speed of a semiconductor device is required to achieve high integration and advanced operating capabilities. This requirement is accompanied by progress in miniaturization of LSI internal wiring and an increase in the number of layers. Miniaturization of wiring and an increase in the number of layers will cause the wiring resistance and the inter-wiring capacity to be increased and will affect the signal transfer speed in the wiring. Since an increase in the signal transfer speed is subjected to restrictions due to this delay time, the dielectric constant of the inter-layer insulation film is reduced to decrease the inter-wiring capacity. At the same time, the operation speed is improved by reducing the wiring resistance by use of a wiring material of lower resistance.

Therefore, studies have been made on the feasibility of using copper having a low specific resistance of 1.7 $\mu\Omega$cm as wiring material. As a technique to form copper wiring, the Dual Damasscene method is attracting attention. An example of this method will be described with reference to FIGS. 10(a) to 10(h).

FIG. 10(a) shows a substrate formed of a lower layer wiring layer 10a having a lower layer wiring 2b in this example and provided with wire protective film 8 characterized by high insulation on all sides. An insulation film 4 is formed on this substrate, as seen in FIG. 2(b), and a wiring groove 7 to embed wiring and a connection hole 10 to connect between upper and lower wiring are formed in said insulation film 4, as seen in FIG. 10(c). Since an insulating wire protective film 8 is located between the lower layer wiring layer 10a and the insulation film 4, the wire protective film 8 can be removed from the bottom of the connection hole 10. After barrier layer 3 has been formed on the surface of both the wiring grooves 7 and the connection hole 10, as seen in FIG. 10(d), a seed layer 5 is formed thereon, as seen in FIG. 10(e). Then, the wiring grooves 7 and the connection hole 10 are filled with wiring material 6, as seen in FIG. 10(f). Next, CMP (Chemical Mechanical Polishing) is used to remove the excess portion of the wiring material 6, and wiring plug 11 in the wiring 2 and connection hole 10 of the upper layer are formed simultaneously, as seen in FIG. 10(g). Then a wire protective film 8 is formed so as to cover the wiring 2 and insulation layer 4, as seen in FIG. 10(h). This Dual Damasscene method allows the wiring 2 and wiring plug 11 to be formed at one time, thereby ensuring a substantial reduction of the process cost.

Incidentally, copper reacts with insulation film 4 and is diffused in the insulation film. To ensure good wiring reliability, the insulating wire protective film 8 and barrier film 3 must be provided between the copper wiring 2 and the insulation film 4, as described above. Conventionally, a metal nitride, such as titanium nitride, tantalum nitride and tungsten nitride, which are capable of preventing copper diffusion, metals of high melting point, such as tantalum and tungsten and alloys thereof, have been used as a barrier film 3. In the meantime, an insulating silicon nitride film (SiN) has been used as the wire protective film 8 on the copper wiring 2.

However, SiN has a specific dielectric constant of 7.0 to 9.0. It has a dielectric constant twice that of an insulation film of $SiO_2$, for example. Hence, it has been hindering reduction in the inter-wiring electric capacity in an extremely fine wiring pattern. To solve this problem, the electric capacity can be reduced by formation of a conductive film serving as a wire protective film on the top surface of the wiring.

U.S. Pat. No. 5,695,810 discloses that a cobalt-tungsten-phosphorus conducting film is formed by electroless plating as a wire protective film. In cobalt-tungsten-phosphorus electroless plating, sodium hypophosphite is commonly used as a reducing agent. Sodium hypophosphite is a known inert reducing agent without reaction occurring on copper which cannot be plated directly on copper (e.g. G. O. Mallory, J. B. Hajdu, "Electroless Plating—Fundamentals & Applications", American Electroplaters And Surface Finishers Society, Florida, Page 318, 1990). Hence, a cobalt-tungsten-phosphorus film must be formed by electroless plating after a seed layer, such as palladium, has been applied on the copper wiring. In this case, however, the palladium may react with the copper constituting the wiring layer to increase the copper resistance. Further, palladium may deposit on the insulation other than the wiring, so that a cobalt-tungsten-phosphorus film may be formed on the insulation other than wiring. Therefore, this involves a problem of reducing inter-wiring insulation required when producing fine wiring.

Furthermore, Japanese Official Patent Gazette 16906/1999 discloses the use of cobalt-containing electroless plating as an antioxidant film. However, the cobalt-containing film obtained from said method has an insufficient prevention capacity for a copper diffusion preventive film. If heat treatment is carried out in a semiconductor device forming process or after formation, copper diffuses into the $SiO_2$ via the cobalt-containing film.

Japanese Official Patent Gazette 120674/1994 discloses that, in the production of the circuit substrate, an intermediate metallic film consisting of tungsten-cobalt-boron alloy as main component is formed on the surface of the wiring board provided with a wiring conductor and is coated with a circuit conductor composed of copper. However, the intermediate metallic film consisting of tungsten-cobalt-boron alloy as a main component is intended to increase the close adhesion between the wiring connector of tungsten or molybdenum on the circuit substrate surface and the circuit conductor of copper formed on the surface thereof; it does not function as a wire protective film between the copper wiring and insulation.

As described above, SiN which has been used as a wire protective film is an insulating material, and it has a high specific dielectric constant. It has been a factor hindering reduction of the inter-wiring electric capacity. To solve this problem, a wiring protective film can be formed with a metallic material allowing electric capacity to be reduced. However, metal nitrides, such as titanium nitride, tantalum nitride and tungsten nitride, which have been used as a wire protective film, and metals having a high melting point, such as tantalum and tungsten and alloys thereof, cannot be formed on the copper wiring alone on a selective basis. To avoid short circuiting between wires, such complicated processes as patterning and etching are required. This will cause deterioration in wiring formation accuracy and reliability. Thus, the following two issues must be solved in order to form a wire protective film with metallic materials:

(i) To ensure copper wiring reliability, it is necessary to form a metallic material capable of preventing copper diffusion without allowing the copper wiring to be oxidized in heat treatment.

(ii) Metallic material specified in (i) must be formed on the copper wiring alone on a selective basis.

A forming method meeting these two requirements must be provided. When a metal nitride, such as titanium nitride, tantalum nitride and tungsten nitride, or a metal having a high melting point, such as tantalum and tungsten or the alloy thereof, is used as a barrier film, a seed layer must be formed in order to provide copper plating because of high resistance. Especially, if the barrier film capable of working as a power feed layer can be formed, electric copper plating can be provided directly on the barrier film, and the conducting film (copper wiring film) can be formed effectively. Especially, when electroless plating is used to form a conductive barrier film, the barrier film can be formed uniformly despite a complicated configuration of wiring, and it works effectively as a seed layer of electric copper plating. However, a wire protective film or barrier film meeting these conditions has not been known up to the present time.

SUMMARY OF THE INVENTION

The object of the present invention is to solve the technical problems of the prior art. More specifically, the present invention is intended to prevent a rise in resistance due to oxidation of the copper wiring and reduction in the reliability of copper wiring and other elements due to copper diffusion. At the same time, it is intended to provide a semiconductor device and its forming method, wherein said semiconductor device is provided with a copper wire protective film and/or barrier film allowing uniform formation of a copper wiring film despite a complicated configuration.

To achieve the above object, the present invention provides a semiconductor device comprising a wire protective film to cover the top of the copper wiring formed in the insulation film and a barrier film surrounding the side and bottom of the copper wiring, wherein said wire protective film and/or barrier film is formed with a cobalt alloy film containing (1) cobalt, (2) at least one of chromium, molybdenum, tungsten, rhenium, thallium and phosphorus, and (3) boron.

The semiconductor device according to the present invention further characterized in that multiple layers of copper wires are formed in the insulation film, a wiring protective film and barrier film are covered with a cobalt alloy film containing (1) cobalt, (2) at least one of chromium, molybdenum, tungsten, rhenium, thallium and phosphorus, and (3) boron, and the copper wire on the upper layer is electrically connected with the copper wire on the lower layer through said barrier layer.

In another embodiment, the semiconductor device production method is characterized in that an insulation film serving as etching stop layer is further formed on the surface of the insulation film, except where the wire protective film is formed. The formation of such an etch stop layer on all surfaces facilitates the etching connection in the semiconductor device production process.

The present invention provides a semiconductor device production method characterized in that the semiconductor device comprises a wire protective film to cover the top of the copper wiring formed in the insulation film and a barrier film surrounding the side and bottom of the copper wiring; wherein said wire protective film and/or barrier film is formed with cobalt alloy film containing (1) cobalt, (2) at least one of chromium, molybdenum, tungsten, rhenium, thallium and phosphorus, and (3) boron.

The present invention prevents an increase in the resistance due to oxidation of the copper wiring and a reduction in the reliability of the copper wiring and other elements due to copper diffusion, and allows a wire protective film to be formed on the copper wiring alone on a selective basis. Since the barrier film is formed of said electroconducting cobalt alloy film, copper can be plated directly on the barrier film without requiring any power feed layer. This solves the problem of void formation and eliminates the step of forming a seed layer.

In the semiconductor device according to the present invention, said cobalt alloy, namely, wire protective film and/or barrier film, is preferred to have thickness of 100 nm or less and to contain 50 to 95 atomic percent cobalt as a main component, 1 to 40 atomic percent of at least one of chromium, molybdenum, tungsten, rhenium, thallium and phosphorus, and 0.1 to 10 atomic percent of boron.

The following describes the preferred embodiments of the semiconductor device and its production method according to the present invention with reference to drawings. The semiconductor device according to the present invention is basically manufactured according to the following process (See FIG. 1):

(a) A step, as seen in FIG. 1(b), of forming an insulation film 4 on the substrate 10a (not restricted to the lower layer copper wiring 2b and wire protective film 1a to be described later, which are already formed in FIG. 1(a) as an insulation layer;

(b) A step of forming a wiring groove 7 and connection hole 10 on the insulation film 4, as seen in FIG. 1(c);

(c) A step of forming a barrier film 3 on the surfaces in wiring groove 7 and connection hole 10, as seen in FIG. 1(d);

(d) A step of forming a seed layer 5 on the barrier film 4, as seen in FIG. 1(e);

(e) A step of embedding copper film 6 in the wiring groove 7 and hole 10, as seen in FIG. 1(f);

(f) A step of forming copper wiring 2 and wiring plug 11 by removing the copper 6 formed on the insulation film 4, other than in wiring groove 7 and hole 10, as seen in FIG. 1(g);

(g) A step of forming wire protective film 1 on the surface of copper wiring 2, as seen in FIG. 1 (h).

A semiconductor device with wiring layers laminated on the multilayer (four layers in the figure) is formed by repeating these steps (a) to (g) a required number of times as shown in FIG. 2.

The insulated material of $SiO_2$, sylsesquioxane hydroxide and methyl siloxane, various materials of a low dielectric constant, and their laminated film can be used as insulation film 4. Copper wiring 2 can be formed by either electric copper plating or electroless copper plating. As will be described later, the step of forming the seed layer 5 can be eliminated and electroless copper plating of the copper wiring 2 can be facilitated when a cobalt alloy film according to the present invention is used as a barrier film 4.

A high melting point material, such as titanium, tantalum and tungsten or an alloy thereof, and a film nitride, such as titanium nitride, tantalum nitride and tungsten nitride, can be used as a barrier film 3. Further, a cobalt alloy film according to the present invention can also be used. In this case, the step of formation is enabled by immersing the substrate provided with wiring groove 7 and hole 10 into the cobalt based electroless plating bath.

The cobalt-based electroless plating bath contains a metal salt, a reducing agent, a completing agent, a pH regulator and an additive. Cobalt chloride, cobalt sulfide and cobalt nitrate can be used as the cobalt salt. As a tungsten salt, it is possible to use sodium tungstate, ammonium tungstate, ammonium trihydrate phosphotungstate, parapentahydrate anmnonium tungstate, sodium n-hydrate phosphotungstate, 12-tungstosilicic acid 26-water, tungstic acid, tungsten oxide, tungsten sodium citrate, tungsten disilicate, tungsten boride, etc. Sodium tungstate, ammonium tungstate, tungsten acid and tungsten sodium citrate are preferably used. As a molybdenum salt, it is possible to use molybdic acid, molybdenum chloride, potassium molybdate, disodium molybdate dihydrate, ammonium molybdate, silicide n-hydrate molybdate, molybdenum oxide acetylacetonato, sodium phosphomolybdate n-hydrate, molybdenum borate, etc. As a chromium salt, it is possible to use ammonium chromate, ammonium sulfate chromium dodecahydrate, chromium chloride hexahydrate, chromium sulfate, n-hydrate, chromium oxide, chromium borate, sodium dichromate dihydrate, etc. As a rhenium salt, it is possible to use ammonium perrhenate, potassium hexachlororhenate, etc. As a thallium salt, it is possible to use thallium nitrate, thallium formate, thallium sulfate, thallium oxide, etc. Phosphorus can be supplied from sodium phosphinate monohydrate, 3-aminopropyl phosphinic acid and phosphinic acid.

To form a wire protective film on the copper wiring 2 alone selectively, the reducing agent is hydrazine and a boron compound where the reaction proceeds on the surface of the copper wiring 2 and cobalt-plated film. It is also possible to use dimethyl amineborane, diethyl amineborane, amineborane, morpholine borane, pyridine borane, piperidine borane, ethylene diamine borane, ethylene diamine bis-borane, t-butyl amine borane, imidazol borane, methoxyethyl amine borane, sodium borohydride, etc. Use of such a reducing agent allows the wire protective film 1 to be formed directly on the copper wiring 2 without applying such a plating catalyst as palladium.

Citrate, succinate, malonate, malate, tartrate, etc. are preferred to be used as a completing agent. Alkali metal hydroxide such as sodium hydroxide, and potassium hydroxide, and organic alkali, such as ammonium, ammonium tetramethyl, ammonium tetraethyl, choline, etc. are preferred as a pH regulating alkali solution. A known surfactant, such as thiourea, saccharin, boric acid, thallium nitrate and polyethylene glycol, can be used as an additive. The temperature of the plating solution is preferred to be from 40 to 90° C.

The wire protective film 1 formed by using this cobalt based electroless plating bath covers the top of the copper wiring 2 on an selective basis, as illustrated. Herein the wire protective film 1 exhibits an isotropic growth from the copper wiring 2, so that the film grows not only in the direction immediately above the copper wiring 2. It grows from the edge of the copper wiring 2 to the top of the barrier film 3 or insulation film 4 by a distance equivalent to the thickness of the wire protective film 1. When the wire protective film 1 is thinner than the barrier film 3, it grows to the top of the barrier film 3. If the wire protective film 1 is thicker than the barrier film 3, it expands to the top of the insulation film 4 over the barrier film 3. Further, if plating reaction in the surface of the barrier film 3 formed in step (c) is active, it is formed by extending beyond the top of the insulation film 4 isotropically from the edge of the barrier film 3, as shown in FIG. 3. Thus, due to isotropic growth of the wire protective film, the edge of the wire protective film 1 is round, not rectangular.

When the removed amount of the copper wiring 2 is greater than that of the barrier film 4 due to excessive polishing in the step (f), and the copper wiring 2 is more concave than the barrier film 4, namely, when so-called dishing has occurred, the cobalt based electroless plating solution is selected to ensure that deposition occurs only to the top of the copper wiring 2 without any deposition on the barrier film 4. Then, the concave portion of the copper wiring 2 can be reduced, and this is preferable.

DESCRIPTION OF THE PREFERRED EMBODIMENTS

Embodiment 1

Figure 1A:
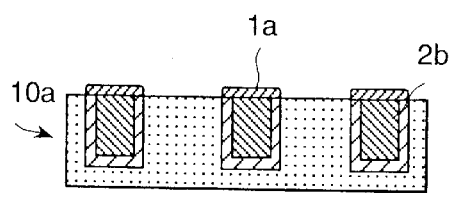
FIGS. 1(a) to 1(h) are sectional diagrams showing successive steps in the production of a semiconductor device representing one embodiment of the present invention.
Figure 1B:
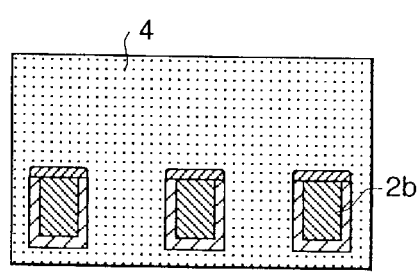
Figure 1C:
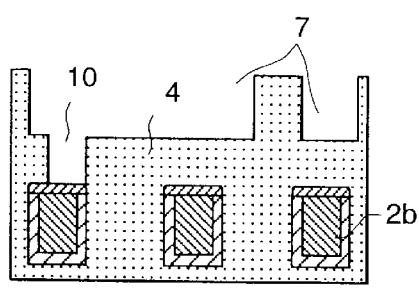
Figure 1D:
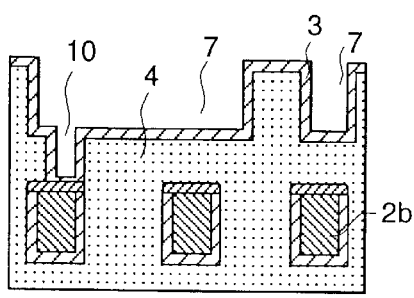
Figure 1E:
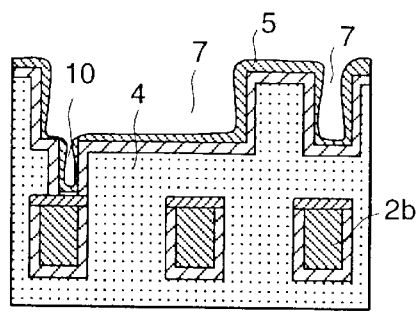
Figure 1F:
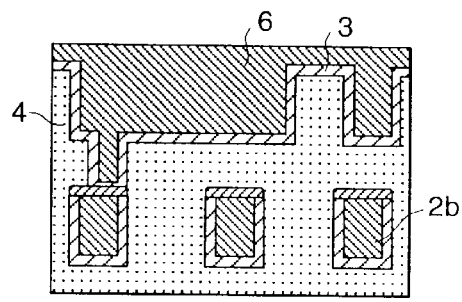

The following embodiment will be described with reference to FIG. 1. Element formation was performed on a silicon substrate having a diameter of 200 mm to form a copper wiring 2b on the lower layer, as seen in FIG. 1(a). Then, a SiO$_2$ insulation film 4 with a thickness of 1 microns, as seen in FIG. 1(b), was formed. Then, wiring groove 7 and connection hole 10 were formed by dry etching, as seen in FIG. 1(c). The wiring groove 7 was 0.3 micron wide, and the connection hole 10 had a diameter of 0.3 microns. Then, Ta was formed into a film with a thickness of 50 nm as a barrier film 3 by sputtering, as seen in FIG. 1(d). Then, copper was formed to a thickness of 150 nm as a seed layer 5, as seen in FIG. 1(e). For the copper seed layer 5, the film was formed at a speed of 200 to 400 nm/min using a long distance sputtering system for copper sputtering Ceraus ZX-1000 (Nippon Vacuum Co., Ltd.). This substrate was dipped in a plating solution and was subjected to electric plating 6 at a solution temperature of 24° C. and current density of 1 A/dm$^2$ for five minutes. Copper was embedded into the wiring groove 7 and connection hole 10 to form copper film 6, as seen in FIG. 1(f). Phosphorus-containing copper was used as an anode.

Copper sulfate: 0.4 mol/dm$^3$

Sulfuric acid: 2.0 mol/dm$^3$

Chloride ion: 1.5×10$^{-3}$ mol/dm$^3$

Microfab Cu2100: 10×10$^{-3}$ dm$^3$/dm$^3$ (Copper plating additive by Nippon Electroplating Enclosures Co., Ltd.)

Then, chemical mechanical polishing was carried out using Model 472 chemical mechanical polishing equipment by IPEC, an alumina dispersed wheel containing 1 to 2% hydrogen peroxide, and a pad (IC1000 by Rohdel). Polishing was performed up to the barrier film 3 at a polishing pressure of 190 g/cm$^2$ to separate the wiring conductor and to form copper wiring 2, as seen FIG. 1(g). Then, it was washed in 5 wt. % sulfuric acid for one minute, then in pure water for one minute.

Figure 1G:
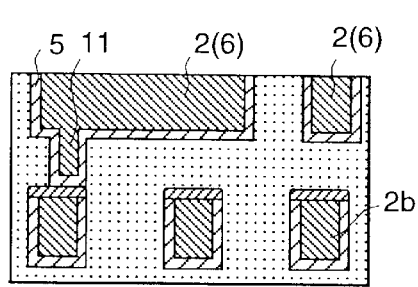
Figure 1H:
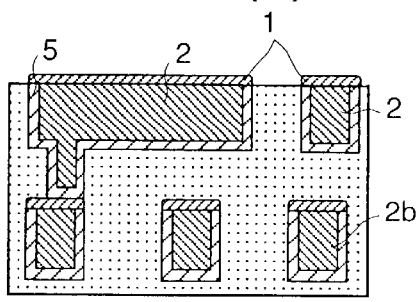

After that, the substrate was dipped in the following plating solution in order to form the wire protective film 1, and was subjected to cobalt based electroless plating under the following plating conditions, as seen in FIG. 1(h). Then the substrate was washed in pure water.

Cobalt chloride: 0.1 mol/dm$^3$

Trisodium citrate: 0.3 mol/dm$^3$

Dimethylamine boron: 0.06 mol/dm$^3$

Sodium tungstate: 0.03 mol/dm$^3$

RE610: 0.05 g/dm$^3$ (Surfactant by Toho Kagaku Co., Ltd.)

Plating conditions pH: 9.5 (regulated by KOH)

Solution temperature: 75° C.

Plating time: 10 min.

The semiconductor device produced in accordance with the procedure described above was treated by a FIB (focused ion beam). The cross section of the device including the wiring groove 7 and connection hole 10 was observed by a scanning electron microscope (hereinafter abbreviated as "SEM"), and it was found that a cobalt-tungsten-boron alloy having a film thickness of 80 nm was uniformly deposited on the surface of the copper wiring 2. However, no deposition of cobalt-tungsten-boron alloy was observed on the insulation film 4. Thus, it has been made clear that it is possible to form the wire protective film 1 only on the copper wiring 2 using the plating method of the present embodiment.

The obtained cobalt alloy was analyzed by Auger electron spectroscopy, and it was found that the film is an electroless plating film comprising 79 atomic percent cobalt, 20 atomic percent tungsten and 1 atomic percent boron.

Then, the semiconductor device was subjected to annealing in an atmosphere of 2% hydrogen and 98% helium gas at 500° C. for 30 minutes. The surface was measured by Auger electron spectroscopy, but copper was not detected on the surface. No diffusion of copper as a wiring material was observed. There was no wiring resistance before and after heat treatment. An increase in the wiring resistance due to oxidation of copper was not observed.

Thus, according to electroless plating of the present embodiment, cobalt-tungsten-boron alloy serving as a wire protective film 1 was formed on the copper wiring 2 on a selective basis. Further, the wire protective film 1 prevents oxidation of the copper wiring 2 and diffusion of copper from copper wiring 2 into the insulation film 4, and reduces any increase in the resistance of the copper wiring 2. Therefore, a highly reliable semiconductor device could be obtained.

Reference Example 1

The following description is directed to an example of forming a wire protective film 1 of cobalt-tungsten-phosphide alloy according to electroless plating as Reference Example 1. Sodium hypophosphite was used for the cobalt-tungsten-phosphide plating solution as a reducing agent, so that a plating reaction will not take place on the copper. Plating cannot be performed directly on the copper wiring 2. Plating requires a catalyst 9 such as palladium to be provided on the copper wiring 2 in advance. As a pretreatment of the plating, the following palladium catalyzing process was carried out on the silicon substrate with the copper wiring 2 formed thereon.

Palladium chloride: 0.003 mol/dm$^3$

Hydrochloric acid: 1×10$^{-3}$ mol/dm$^3$

Acetic acid: 0.5 mol/dm$^3$

Hydrofluoric acid: 5×10$^{-3}$ mol/dm$^3$

Temperature: 24° C.

Time: 10 sec.

In the treatment of catalyzation, palladium having an average size of 50 nm was deposited in an insular form on the surface of the semiconductor device. After having been washed in pure water for one minute, the semiconductor device was dipped in the plating solution shown in Table 1 and was subjected to cobalt based electroless plating under the same plating conditions as those of the embodiment 1. After cobalt based electroless plating, the semiconductor device was washed in pure water.

Figure 8:
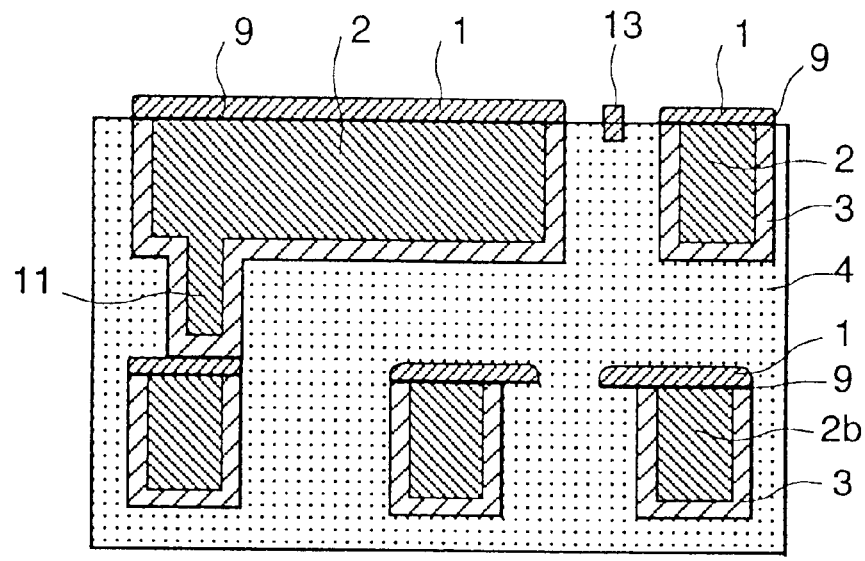
FIG. 8 is a cross sectional view showing a conventional semiconductor device.
Figure 9:
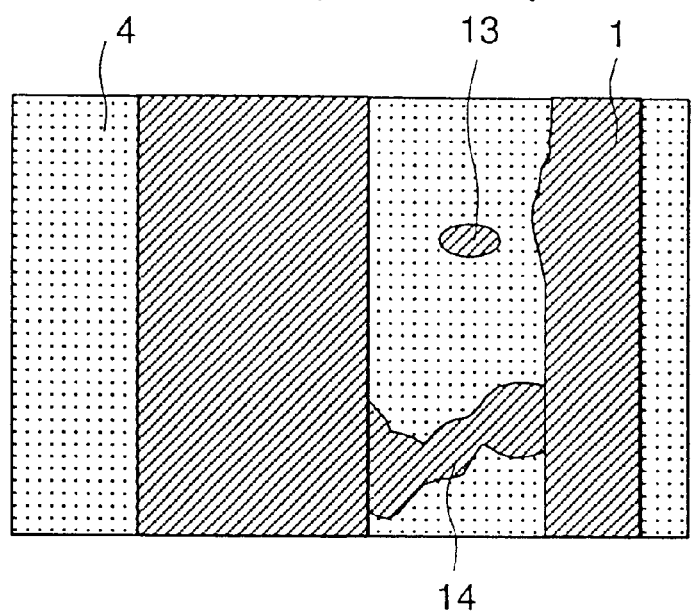
FIG. 9 is a top plan view of a conventional semiconductor device.

The cross sectional view of this semiconductor device was observed by SEM, and a cobalt-tungsten-phosphide alloy plating film was found to be deposited on the surface. This cobalt alloy was an electroless plating film comprising 84 atomic percent cobalt, 8 atomic percent tungsten and 8 percent phosphorus. Inter-wiring faulty deposition portion 13 (FIG. 8) and inter-wiring short circuited portion 14 (FIG. 9) were found on the surface of the semiconductor device in addition to the wire protective film 1 formed on the copper wiring 2. Also, number of the surface irregularities increased.

Then, the semiconductor device was annealed at 400° C. for 30 minutes in an atmosphere of 2 percent hydrogen and 98 percent helium gas, and 6 atomic percent copper was detected on the surface. Diffusion of copper as a wiring material was also observed. Further, the wiring resistance before and after heat treatment exhibited an increase of 10 percent.

Embodiments 2 to 5

The following description is directed to embodiments 2 to 5, where a cobalt-tungsten-boron alloy was formed on the surface of the copper wiring 2 as a wire protective film 1.

In embodiment 2, cobalt based electroless plating solution was made to be an ammoniacal alkaline, as shown in Table 1, and a plating solution without containing alkaline metal salt was used. Plating conditions were the same as those of the embodiment 1. Ammonium water was used for preparation of acidity (pH).

In the embodiment 3, the cobalt based electroless plating solution has the percentage of components as shown in Table 1. The wire protective film 1 was formed as in the case of embodiment 1. In embodiment 4, the copper wiring 2 was formed by electroless plating, and the wire protective film 1 was formed on the copper wiring 2 by cobalt based electroless plating. Similarly to embodiment 1, the element was formed on the silicon substrate, and copper seed layer 5 was formed on the wiring groove 7 and connection hole 10, as seen in FIG. 1(*e*). Then, the substrate was immersed in the following copper plating bath to form copper film 6.

Copper sulfate: 0.04 mol/dm$^3$
Disodium ethylene diamine tetraacetate: 0.1 mol/dm$^3$
Formaldehyde: 0.03 mol/dm$^3$
2,2'-bipyridyl: 0.0002 mol/dm$^3$
Polyethylene glycol: 0.03 mol/dm$^3$ (average molecular weight: 600)
Plating conditions
pH: 9.5 (Regulated by sodium hydroxide)
Solution temperature: 70° C.

After that, chemical mechanical polishing was performed to separate the wiring conductor. Then, cobalt based electroless plating was performed, as in the case of embodiment 1.

Cobalt based electroless plating solution as used in embodiment 5 in the form of an alkaline using alkaline tetramethyl ammonium was employed as shown in Table 1. It was a plating solution not containing an alkali metal base. The plating conditions were the same as those in the embodiment 1, provided that tetramethyl ammonia water was used to formulate the acidity (pH).

Cobalt-tungsten-boron alloy was found to be uniformly deposited on the copper wiring 2 of the semiconductor device of embodiments 2 to 5 produced in the steps described above. Cobalt alloy deposition was not observed on the insulation film 4. Thus, it was possible for the wire protective film 1 to be formed only on the surface of the copper wiring 2, according to the plating in each embodiment.

Then, the semiconductor device of embodiments 2 to 4 was annealed at 400° C. and the semiconductor device of embodiment 5 was annealed at 500° C. for 30 minutes under an atmosphere of 2 percent hydrogen and 98 percent helium gas.

In any of these embodiments, copper was not detected on the surface, and diffusion of copper as a wiring material was not observed. Table 1 shows the percentage of component elements in the wire protective film 1 in each embodiment measured by Auger electron spectroscopy.

TABLE 1

| | Plating solution | | | | | | | |
|---|---|---|---|---|---|---|---|---|
| | Cobalt chloride [mol/dm$^3$] | Trisodium citrate [mol/dm$^3$] | Di-ammonium hydrogen citrate [mol/dm$^3$] | Citric acid [mol/dm$^3$] | Dimethylamine borane [mol/dm$^3$] | Sodium hypophosphite [mol/dm$^3$] | Sodium tungstate [mol/dm$^3$] | Ammonium tungstate [mol/dm$^3$] |
| Embodiment 1 | 0.1 | 0.3 | — | — | 0.06 | — | 0.03 | — |
| Embodiment 2 | 0.1 | — | 0.3 | — | 0.06 | — | 0.03 | 0.03 |
| Embodiment 3 | 0.2 | 0.3 | — | — | 0.06 | — | 0.01 | — |
| Embodiment 4 | 0.1 | 0.3 | — | — | 0.06 | — | 0.03 | — |
| Embodiment 5 | 0.1 | — | — | 0.3 | 0.06 | — | 0.03 | — |
| Reference Example | 0.1 | 0.3 | — | — | — | 0.2 | 0.03 | — |

| | Plating solution | | Cobalt alloy composition [atomic %] | | | | Thickness of protective film [nm] | Copper diffusion |
|---|---|---|---|---|---|---|---|---|
| | Tungstate [g/dm$^3$] | RE610 (Surfactant by Toho Kagaku Co., Ltd.) [mol/dm$^3$] | Co | W | B | P | | |
| Embodiment 1 | — | 0.05 | 79 | 20 | 1 | — | 80 | Not diffused |
| Embodiment 2 | — | 0.05 | 81 | 18 | 1 | — | 80 | Not diffused |
| Embodiment 3 | — | 0.05 | 85 | 13 | 2 | — | 70 | Not diffused |
| Embodiment 4 | — | 0.05 | 79 | 20 | 1 | — | 80 | Not diffused |
| Embodiment 5 | 0.03 | 0.05 | 78 | 21 | 2 | — | 60 | Not diffused |
| Reference Example | — | 0.05 | 84 | 8 | — | 8 | — | Diffused 6 atomic % |

According to the steps described above, a cobalt-tungsten-boron alloy could be formed on the copper wiring 2 as wire protective film 1 on a selective basis in embodiments 2 to 5, as in the case of embodiment 1, thereby producing a highly reliable semiconductor device. Further, a wire protective film was formed using a plating solution not containing an alkali metal base in embodiment 5. This has succeeded in avoiding contamination due to such alkali metals as sodium or potassium.(Embodiments 6 to 13 and Reference Examples 2 to 3)

In embodiments 6 to 13, a wire protective film 1 was formed at the percentage of component elements shown in Table 2, and a service life test was conducted. For the semiconductor device of each embodiment, the wiring layer shown in FIG. 2 was produced in four layers by repeating the steps <1> to <8>, as shown in FIGS. 1(a) to 1(h). In the service life test, the rise of wiring resistance was measured at the end of 600 hours and at the end of 1,200 hours.

Wiring shape (a) wire width: 0.3 microns (b) film width: 1.0 microns (c) Wire length: 2.5 mm Test conditions (a) Temperature: 175° C. (b) Current density: $3 \times 10^6$ A/cm$^2$ Table 2 shows the percentage of component elements of the wire protective film 1 and the result of the service life test. Table 2 shows Reference Example 2 where a wire protective film is not formed, and Reference Example 3 where cobalt-tungsten-phosphorus film is formed as a wire protective film 1, similarly to the Reference Example 1.

TABLE 2

| | Cobalt alloy composition (atomic %) | | | | | Service life test | | |
|---|---|---|---|---|---|---|---|---|
| | | | | | | Ratio of wiring resistance between before annealing and after annealing (percent) | | |
| | Co | W | P | O | B | 600 hours | 1200 hours | Copper diffusion |
| Embodiment 6 | 79 | 20 | — | — | 1 | 1% or less | 2% or less | Not diffused |
| Embodiment 7 | 81 | 18 | — | — | 1 | 1 | 3 | Not diffused |
| Embodiment 8 | 85 | 13 | — | — | 2 | 2 | 4 | Not diffused |
| Embodiment 9 | 65 | 34 | — | — | 1 | 2 | 4 | Not diffused |
| Embodiment 10 | 98 | 1 | — | — | 1 | 3 | 6 | Not diffused |
| Embodiment 11 | 79.8 | 20 | — | — | 0.1 | 1 | 4 | Not diffused |
| Embodiment 12 | 74 | 20 | — | — | 6 | 2 | 3 | Not diffused |
| Embodiment 13 | 70 | 18 | — | 11 | 1 | 2 | 5 | Not diffused |
| Reference Example 2 | Without wire protective film layer | | | | | 16 | 30 | Diffused |
| Reference Example 3 | 84 | 8 | 8 | — | | 6 | 15 | Diffused |

The cobalt-tungsten-boron alloy film of the embodiment 13 contains 11 percent oxygen. This oxygen is an impure component taken inside when the wire protective film 1 was formed. When analyzed in greater detail in other embodiments, carbon, chlorine, sulfur, heavy metal and other impurities are considered to be included. However, the rise in the wiring resistance is smaller than that of Reference Examples 2 and 3. Further, copper was not detected in the insulation film 4. Thus, cobalt alloy film containing this oxygen is effective as wire protective film 1.

According to the result shown in Table 2, the wire protective film 1 of cobalt-tungsten-boron alloy in embodiments 6 to 13 shows a smaller rise of wiring resistance than those of the Reference Examples 2 and 3. No copper was detected in the insulation film 4. Hence, the wire protective film 1 in embodiments 6 to 13 was stable for a long time, and it prevented oxidation of copper wiring 2 and diffusion of copper into the insulation film 4 from copper wiring 2, thereby producing a highly reliable semiconductor device.

Embodiments 14 to 25

In embodiments 14 to 25, copper wiring 2 was formed on the silicon substrate, as in the case of embodiment 1. This substrate was immersed in the plating bath shown in Table 3 and was subjected to cobalt based electroless plating. Plating conditions were the same as those of embodiment 1.

In embodiment 24, a carbon hydride based organic insulation film material of low dielectric constant was used as insulation film 4. Similarly to embodiment 1, the element was formed on the silicon substrate. For example, SiLK (tradename of Dow Chemical) as an organic insulation film was spin-coated on the substrate to a thickness of 300 nm. This was heat-treated and hardened in an atmosphere of nitrogen ($N_2$) at a temperature of 400° C. for 30 minutes. SiLK (tradename of Dow Chemical), BCB (tradename of Dow Chemical), FLARE (tradename of Allied Signal) and VELOX (tradename of Shuhmacher) can be used as a carbohydrate based organic insulation film material including aromatic compounds. This process was followed by the step of patterning to form a wiring groove 7 and connection hole 10. As in the case of embodiment 1, the copper wiring 2 was formed, and the wire protective film 1 was formed and washed.

Cobalt alloy with a film thickness of 80 nm was uniformly deposited on the surface of the copper wiring 2 of the semiconductor device of embodiments 14 and 24 produced in the steps. Further, no cobalt alloy deposition was observed on the insulation film 4. Hence, according to the plating procedure in embodiments 14 to 23, it was possible for the wire protective film 1 to be formed only on the surface of the copper wiring 2. As in the case of embodiment 24, it was possible for the wire protective film 1 to be formed only on the surface of the copper wiring 2, independently of the type of insulation film 4. Table 3 shows the percentage of component elements for the wire protective film 1 of each embodiment. The annealing temperature was 400° C. in embodiments 14 and 21, 450° C. in embodiments 15 to 19, 22 and 23 and 500° C. in embodiments 20 and 24.

TABLE 3

| | Plating solution | | Cobalt alloy composition (atomic %) | | | | | | | | Copper diffusion |
|---|---|---|---|---|---|---|---|---|---|---|---|
| | | | Co | Cr | Mo | Re | Ti | P | W | B | |
| Embodiment 14 | Cobalt chloride: 0.1 mol/dm$^3$ | Chromium trichloride: 0.1 mol/dm$^3$ | 95 | 3 | — | — | — | — | — | 2 | Not diffused |
| Embodiment 15 | Trisodium citrate: 0.3 mol/dm$^3$ | Disodium molybdate: 0.1 mol/dm$^3$ | 88 | — | 10 | — | — | — | — | 2 | Not diffused |

TABLE 3-continued

| | | Plating solution | Cobalt alloy composition (atomic %) | | | | | | | | Copper diffusion |
|---|---|---|---|---|---|---|---|---|---|---|---|
| | | | Co | Cr | Mo | Re | TI | P | W | B | |
| Embodiment 16 | Dimethylamine borane: 0.06 mol/dm³ | Ammonium perrhenate: 0.03 mol/dm³ | 65 | — | — | 30 | — | — | — | 5 | Not diffused |
| Embodiment 17 | RE610: 0.05 g/dm³ | Thallium nitrate: 0.01 mol/dm³ | 96 | — | — | — | 2 | — | — | 2 | Not diffused |
| Embodiment 18 | (Surfactant by Toho Kagaku Co., Ltd.) | Phosphinic acid: 0.1 mol/dm³ | 89 | — | — | — | — | 10 | — | 1 | Not diffused |
| Embodiment 19 | | Sodium tungstate: 0.03 mol/dm³ Phosphinic acid: 0.2 mol/dm³ | 80 | — | — | — | — | 10 | 9 | 1 | Not diffused |
| Embodiment 20 | | Sodium tungstate: 0.03 mol/dm³ Ammonium perrhenate: 0.03 mol/dm³ | 66 | — | — | 12 | — | — | 21 | 1 | Not diffused |
| Embodiment 21 | | Sodium tungstate: 0.03 mol/dm³ Chromium trichloride: 0.1 mol/dm³ | 80 | 2 | — | — | — | — | 17 | 1 | Not diffused |
| Embodiment 22 | | Sodium tungstate: 0.03 mol/dm³ Disodium molybdate: 0.1 mol/dm³ | 72 | — | 13 | — | — | — | 14 | 1 | Not diffused |
| Embodiment 23 | | Sodium tungstate: 0.3 mol/dm³ Thallium nitrate: 0.01 mol/dm³ | 78 | — | — | — | 3 | — | 18 | 1 | Not diffused |
| Embodiment 24 | | Sodium tungstate: 0.03 mol/dm³ | 79 | — | — | — | — | — | 20 | 1 | Not diffused |

The semiconductor device of embodiments 14 to 25 produced according to the steps described above was annealed at 400° C., 450° C. and 500° C. for 30 min. in an atmosphere 22 percent hydrogen and 98 percent helium gas.

After annealing at 400° C., no copper was detected on the surface of the semiconductor device of each embodiment. In the case of the annealing shown in Table 3, diffusion of copper as a wiring material was not observed. This has made it clear that the wire protective film 1 of embodiments 14 to 23 has a lower heat resistance than the wire protective film 1 of embodiment 1, but prevents copper from diffusing without any problem at the heating temperature of 400° C. in the process of forming the copper wiring 2. Further, there is no change in wiring resistance before and after heat treatment at 400° C. It has been confirmed that there is no rise in the wiring resistance due to copper oxidation.

The above discussion has made it clear that, when the electroless plating method in the present embodiment is used, a cobalt-tungsten-boron alloy serving as a wire protective film 1 of the copper wiring 2 can be formed on the copper wiring 2 on an selective basis. In addition, oxidation and diffusion of copper can be prevented, thereby obtaining a semiconductor device of high reliability.

Embodiments 25 to 35

In embodiments 25 and 35, a semiconductor device was produced in which the wire protective film 1 was formed at the percentage of component elements shown in Table 4. Then, the same service life test as that in embodiment 6 was conducted. The semiconductor device in each embodiment has the same structure as that of the semiconductor device in the embodiment 6 (FIG. 4).

Figure 4:
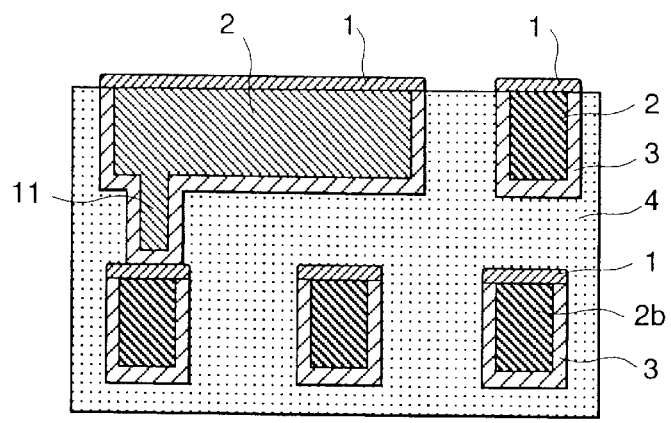
FIG. 4 is a cross sectional view showing still another embodiment of the semiconductor device of the present invention.

In the embodiment 25, an organic insulation film of low dielectric constant was used as the insulation film 4 in the semiconductor device shown in FIG. 4. The organic insulation film material used was SiLK by Dow Chemical (dielectric constant of about 2.65).

TABLE 4

| | Cobalt alloy composition (atomic %) | | | | | | | | Service life test | | |
|---|---|---|---|---|---|---|---|---|---|---|---|
| | | | | | | | | | Rise of wiring resistance (percent) | | |
| | Co | Cr | Mo | Ra | TI | W | P | B | 600 hours | 1200 hours | Copper diffusion |
| Embodiment 25 | 81 | — | — | — | — | 18 | — | 1 | 1 | 3 | Not diffused |
| Embodiment 26 | 95 | 3 | — | — | — | — | — | 2 | 3 | 6 | Not diffused |
| Embodiment 27 | 88 | — | 10 | — | — | — | — | 2 | 2 | 4 | Not diffused |
| Embodiment 28 | 65 | — | — | 30 | — | — | — | 5 | 2 | 3 | Not diffused |
| Embodiment 29 | 96 | — | — | — | 2 | — | — | 2 | 2 | 7 | Not diffused |
| Embodiment 30 | 89 | — | — | — | — | — | 10 | 1 | 3 | 8 | Not diffused |
| Embodiment 31 | 80 | — | — | — | — | 9 | 10 | 1 | 1 | 3 | Not diffused |
| Embodiment 32 | 66 | — | — | 12 | — | 21 | — | 1 | 1 | 2 | Not diffused |
| Embodiment 33 | 80 | 2 | — | — | — | 17 | — | 1 | 2 | 5 | Not diffused |
| Embodiment 34 | 72 | — | 13 | — | — | 14 | — | 1 | 1 | 3 | Not diffused |
| Embodiment 35 | 78 | — | — | — | 3 | 18 | — | 1 | 2 | 4 | Not diffused |

The result given in Table 4 has revealed that there is no rise in wiring resistance and copper is not detected in the insulation film 4 in the semiconductor device where the cobalt alloy film containing (1) cobalt, (2) at least one of chromium, molybdenum, tungsten, rhenium, thallium and phosphorus, and (3) boron is formed as the wire protective film 1 of the copper wiring 2. Hence, the wire protective film 1 of the embodiments 26 to 35 is stable for a long time, and oxidation of the copper wiring 2 and diffusion of copper from the copper wiring 2 into the insulation film 4 can be avoided. This has made it possible to obtain a semiconductor device of high reliability.

Embodiments 36 to 38 and Reference Example 4

In the embodiments shown above, a cobalt alloy film containing (1) cobalt, (2) at least one of chromium, molybdenum, tungsten, rhenium, thallium and phosphorus, and (3) boron was formed as a wire protective film 1 of the copper wiring 2. The following describes an example of said cobalt alloy film used as a barrier film 3.

In the semiconductor device of the embodiment 36, a cobalt-tungsten-boron alloy was used as a barrier film 3. In embodiment 36, element formation was performed as in the case of embodiment 1 on the silicon substrate to form the wiring groove 7 and connection hole 10, as seen in FIG. 1(c). A cobalt film having a thickness of 5 nm as a catalyst layer was formed on the wiring groove 7 and connection hole 10 by sputtering. This substrate was immersed in the cobalt electroless plating solution shown in Table 5, which was used to form the wire protective film 1 in embodiment 1. It was subjected to cobalt electroless plating to form a cobalt electroless plating film as a barrier film 3. The plating conditions were the same as those when wire protective film 1 was formed in embodiment 1. In the present embodiment, cobalt-tungsten-boron alloy was formed as a barrier film by electroless plating. The present invention is not restricted to this method; a sputtering or chemical vapor deposition method can be used.

Then, copper wiring 2 was formed by electric plating as in the case of embodiment 1, as seen in FIG. 1(g). However, formation of the copper seed layer as performed in embodiment 1 was not required in the present embodiment. The barrier film 3 was used as a power feed layer of copper plating, and copper was plated directly on the barrier film 3. Then, chemical mechanical polishing was performed up to the barrier film 3, as in the case of embodiment 1, to separate the wiring conductor. At this time, it was confirmed that the copper wiring 2 and underlying cobalt electroless plating film have a close adhesion so as to withstand chemical mechanical polishing. After washing, silicon nitride (SiN) was formed to a thickness of 50 nm by sputtering to serve as wire protective film 1 on the copper wiring 2.

In the semiconductor device of the embodiment 37, cobalt-tungsten-boron alloy was used not only for the barrier film 3, but also for the wire protective film 1. As in the case of embodiment 36, copper wiring 2 was formed, and chemical mechanical polishing was carried out. Then, the wire protective film 1 (60 nm thick) of cobalt-tungsten-boron alloy was formed as in the case of embodiment 1.

In embodiment 38, barrier film 3 was formed with cobalt based electroless plating solution used in the embodiment 5. The following shows the plating conditions:

pH value: 8.5 (regulated by tetramethyl ammonium)
Solution temperature: 60° C.
Plating time: for five minutes In Reference Example 4, a semiconductor device was produced wherein barrier film 3 was made of a cobalt-tungsten-phosphor film.

A cobalt-tungsten-boron alloy film having a thickness of 50 nm (for embodiments 36 and 37) and 40 nm (for embodiment 38) was uniformly formed as a barrier film on the side wall and bottom face of wiring groove 7 and connection hole 10 of the semiconductor device of the embodiments 36 to 38 produced according to the procedure described above. Copper wiring 2 was observed at 100 positions, and no void was found. Wiring groove 7 and connection hole 10 were found to be completely filled with copper. Cobalt alloy deposition was not observed on the insulation film 4. Thus, uniform formation of a barrier film 3 made of cobalt-tungsten-boron alloy could be achieved according to the plating procedure in embodiments 36 to 38.

Then, the semiconductor device of each embodiment was annealed at 500° C. for 30 minutes in an atmosphere of 2 percent hydrogen and 98 percent helium gas. In any of the embodiments, no copper was detected on the surface. Diffusion of the copper in the wiring material was not observed. Thus, the cobalt-tungsten-boron alloy was confirmed to function as the barrier film 3 of the copper wiring 2.

Figure 2:
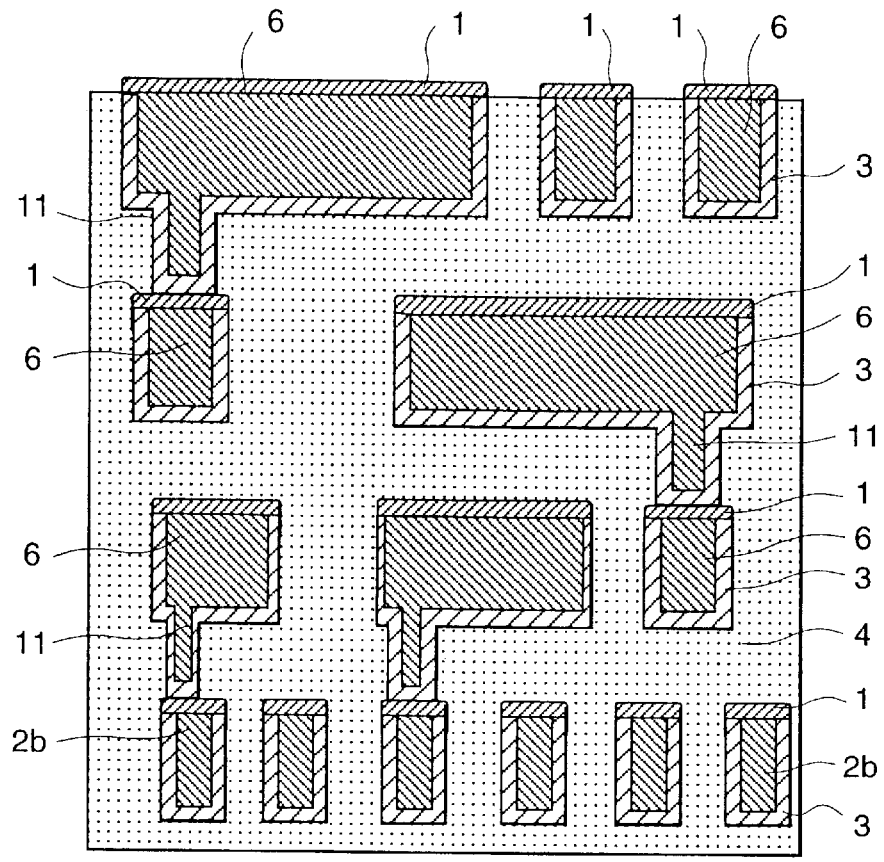
FIG. 2 is a cross sectional view showing one embodiment of the semiconductor device of the present invention.
Figure 3:
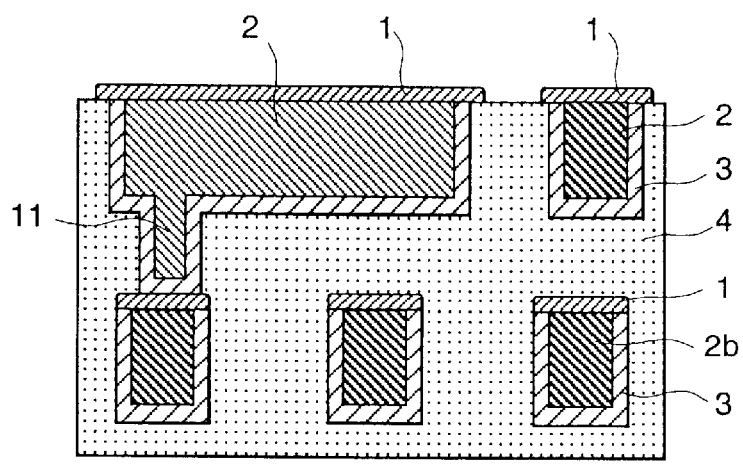
FIG. 3 is a cross sectional view showing another embodiment of the semiconductor device of the present invention.

Then, a service life test was conducted on the semiconductor device of the embodiments 36 to 38 and reference example 4, as in the case of embodiment 6. Each semiconductor device has four layers as shown in FIG. 2. Table 5 shows the percentage of component elements of the barrier layer 3 of each embodiment and the result of evaluating the wiring reliability.

Wiring shape (a) wire width: 0.1 microns (b) film width: 1.0 microns (c) Wire length: 2.5 mm Test conditions (a) Temperature: 175?C. (b) Current density: $3 \times 10^6$ A/cm$^2$

TABLE 5

| | Cobalt alloy composition (atomic %) | | | | | Service life test Rise of wiring resistance (percent) | | Thickness of barrier film | Copper diffusion |
|---|---|---|---|---|---|---|---|---|---|
| | Co | W | P | O | B | 600 hours | 1200 hours | | |
| Embodiment 36 | 79 | 20 | — | — | 1 | 1% or less | 2% or less | 50 | Not diffused |
| Embodiment 37 | 79 | 20 | — | — | 1 | 1% or less | 2% or less | 50 | Not diffused |
| Embodiment 38 | 69 | 25 | — | 5 | 1 | 2 | 5 | 40 | Not diffused |
| Reference Example 4 | 84 | 8 | 8 | — | | 12 | 25 | — | Diffused |

Thus, diffusion of copper from the copper wiring 2 to the insulation film 4 can be avoided by the barrier film 3. The semiconductor device of embodiments 36 to 38 is characterized by long stability and high reliability. The barrier 3 has lower resistance than the film of the conventionally used nitride metal, such as titanium nitride, tantalum nitride and tungsten nitride, metals of high melting point, such as tantalum and tungsten or alloys thereof. So connection resistance between the bottom of connection hole 10 and copper wiring 2b thereunder can be made smaller than before, and the wiring resistance of the semiconductor device can be reduced. This barrier film 3 can be used as a power feed layer for electric copper plating with the result that the copper seed layer need not be formed. This facilitates formation of the copper wiring 2.

In embodiment 36, a cobalt layer was formed by sputtering as a catalyst layer. The cobalt layer can be formed by a wet method instead of a sputtering method. When a palladium layer was formed by a wet method, the barrier film 3 could be formed as in the case of embodiment 36. When the cobalt alloy employed in the wire protective film 1 was used as a barrier film 3 in embodiments 2 to 35, in addition to the cobalt-tungsten-boron alloy, diffusion of copper from the copper wiring 2 to the insulation film 4 could be avoided. Thus, a semiconductor device of high reliability could be obtained.

Embodiment 39

Figure 5:
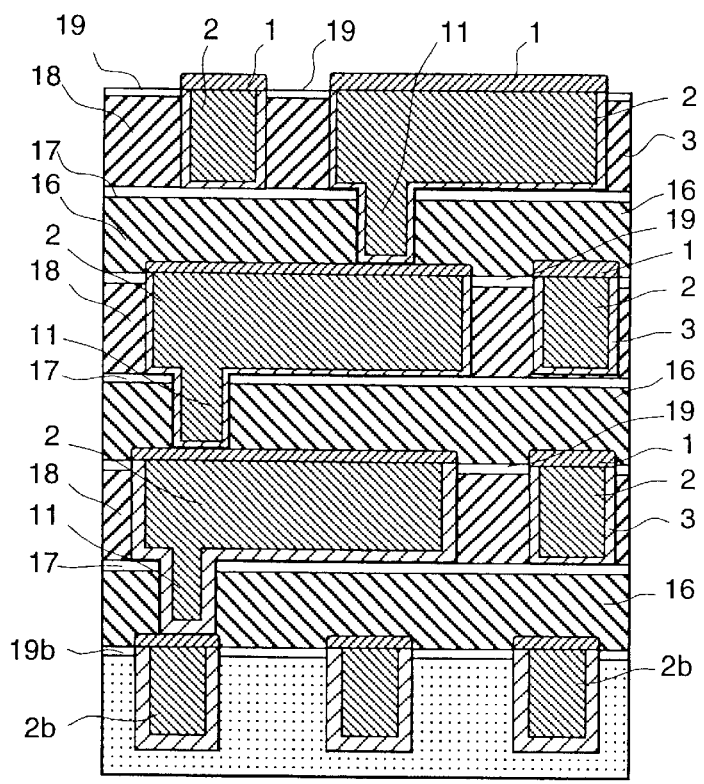
FIG. 5 is a cross sectional view showing a further embodiment of the semiconductor device of the present invention wherein two etching stop layers are provided.
Figure 6:
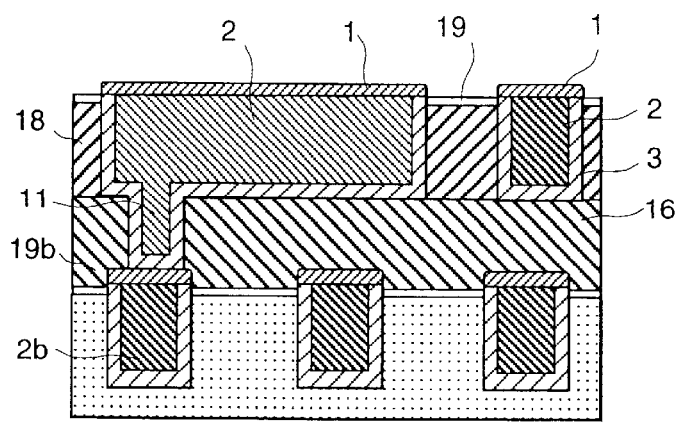
FIG. 6 is a cross sectional view showing a still further embodiment of the semiconductor device of the present invention wherein an etching stop layer is provided only on the top end of the wiring layer.

As shown in FIG. 5, the semiconductor device of the embodiment 39 was provided with insulation films serving as etching stop layers 17 and 19 between layers. As shown in FIG. 6, the etching stop layer 19 can be provided only on the top end of the wiring layer. Etching control is facilitated by providing the etching stop layer. The following describes how to produce the semiconductor device in this embodiment with reference to FIGS. 7(a) to 7(h), which shows the steps used in forming the wiring of the semiconductor device shown in FIGS. 5 or 6 using the Dual Damasscene method.

Figure 7A:
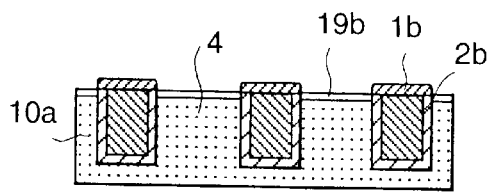
FIGS. 7(a) to 7(h) are sectional diagrams showing successive steps in the production of a semiconductor device provided with the etching stop layer shown in FIGS. 5 and 6.
Figure 7B:
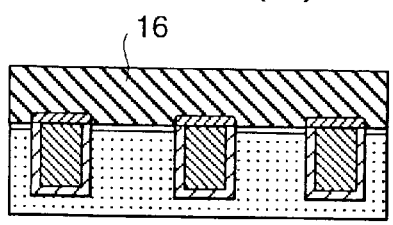

Element formation was performed on the silicon substrate 10a as an insulation film, and the first insulation film 8 having a thickness of 600 nm was formed on the substrate, as seen in FIG. 7(a) where the lower layer wiring 2b was formed. SiLK (dielectric constant: about 2.65) was spin-coated as the first insulation film 16, as seen in FIG. 7(b), and heat treatment and hardening were performed in the nitrogen ($N_2$) atmosphere at a temperature of 400° C. for 30 minutes.

Figure 7C:
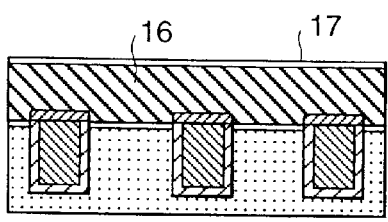
Figure 7D:
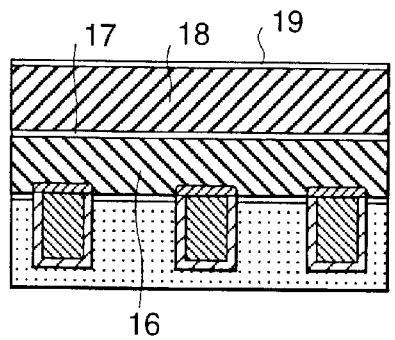

Then, the first etch stop layer 17 was formed on the first insulation film 16, as seen in FIG. 7(c). Methyl siloxane (dielectric constant: about 2.8) having a thickness of 50 nm was formed on the etch stop layer 17 by the plasma CVD. This step was followed by deposition of the second insulation film 18 and the second etch stop layer 19 in the same way, as seen in FIG. 7(d). The second insulation film 18 is SiLK having a thickness of 400 nm, and the second etch stop layer 19 is methyl siloxane having a thickness of 50 nm.

Figure 7E:
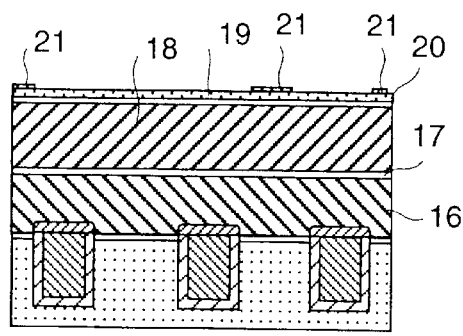
Figure 7F:
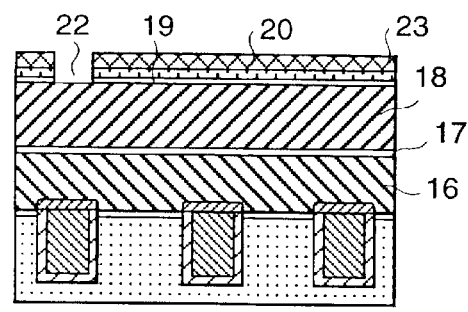

$SiO_2$ film 20 (50 nm) and silicon nitride film 21 (50 nm) were formed on the second etch stop layer 19. Silicon nitride film 21 was patterned by plasma etching using the photo resist mask, as seen in FIG. 7(e). Then, opening 22 was formed by dry etching, using another photo resist 23, as seen in FIG. 7(f).

Figure 7G:
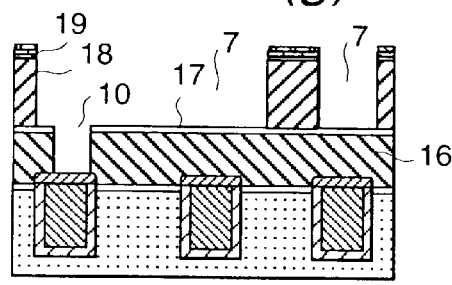

The second insulation film 18 was etched by nitrogen, hydrogen and mixed gas through opening 22 together with photo resist 23. After that, the silicon nitride film 21 is masked, and the $SiO_2$ film 20, methyl siloxane film 19 and first etch stop film 17 were subjected to plasma etching by use of the mixed gas of $C_4H_8$, CO, Ar and $O_2$. Then, wiring groove 7 (0.2 micron wide) and connection hole 10 (diameter 0.2 micron) were formed by etching with mixed gas of nitrogen and hydrogen, as seen in FIG. 7(g). In this case, the first etching stop film 19 forms the position where etching stops.

Figure 7H:
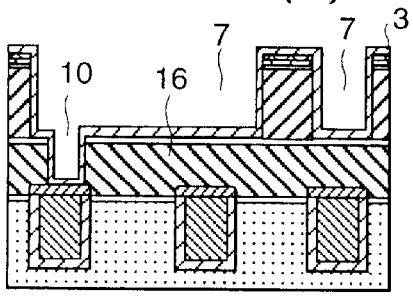

After that, as seen in FIG. 7(h), formation of the barrier film 3 by sputtering, formation of seed layer 5, formation of copper wiring 2 by electric copper plating (or formation of copper wiring 2 directly on the barrier film 3 by electroless copper plating), chemical mechanical polishing, and formation of wire protective film 1 were performed as in the case of the other embodiments. In the case of chemical mechanical polishing, etching stops on the second etching stop layer 19.

The barrier film 3 and/or wire protective film 1 were formed with a cobalt alloy film containing (1) cobalt, (2) at least one of chromium, molybdenum, tungsten, rhenium, thallium and phosphorus, and (3) boron, as in the case of the other embodiments.

Either an inorganic insulation film or an organic insulation film can be used as the insulation film, but the organic insulation film is preferred. The inorganic insulation film is preferred to be made of a material having a siloxane bond, such as $SiO_2$, methyl siloxane, sylsesquioxane hydroxide and methyl siloxane hydroxide, and can be formed by a coating method and a plasma CVD method. The organic insulation film can be made of a carbohydrate based organic insulation film material of low dielectric constant including aromatic compounds such as SiLK (tradename of Dow Chemical), BCD (tradename of Dow Chemical), FLARE (tradename of Allied Signal) and VELOX (tradename of Shuhmacher). The etching stop layer may be made of SiO2 as an inorganic insulation film, methyl siloxane, sylsesquioxane hydroxide, methyl siloxane hydride and other materials containing siloxane bond, silicon nitride, and silicon carbide. Insulation films and etching stop layers can be made of a combination of these materials. To improve the wiring system of the semiconductor device, it is preferred to use a material having a lower dielectric constant than conventionally used $SiO_2$ (dielectric constant: about 4.3) or silicon nitride (dielectric constant: about 7.0 to 9.0).

As shown in FIG. 6, when wiring groove 7 was formed, a difference in the etching stop position on the level of scores of nanometers occurred. It has been confirmed in the service life test that there is no problem if etch stop layer 19 is provided only on the top end of the wiring layer.

In the semiconductor device produced according to said production method, oxidation and diffusion of the copper wiring 2 can be prevented for a long time by the wire protective film 1 and barrier film 3, and any increase in resistance of the copper wiring 2 can be reduced, thereby ensuring a high reliability. Especially, when a cobalt alloy film is used as wire protective film 1, the inter-wiring electric capacity can be reduced by about 10% as compared with the case where silicon nitride as a material of high dielectric constant is used. This reduces the signal transfer delay. The efficiency of the wiring system is improved by use of an organic insulating film of low dielectric constant.

Figure 10A:
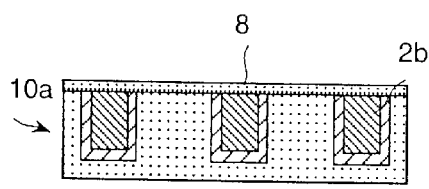
FIGS. 10(a) to 10(h) are sectional diagrams showing successive steps in the production of a conventional semiconductor device.
Figure 10E:
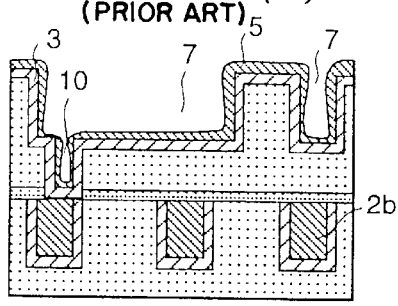
Figure 10B:
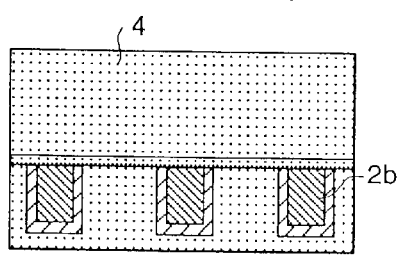
Figure 10F:
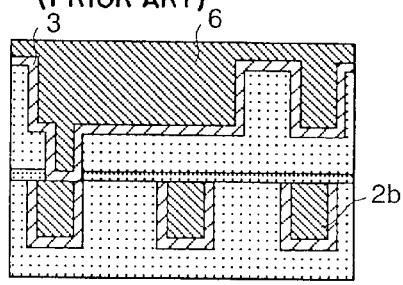
Figure 10C:
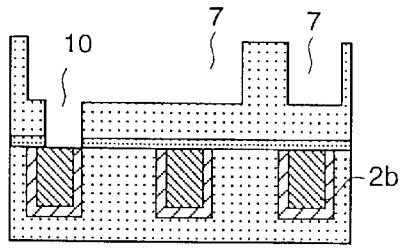
Figure 10G:
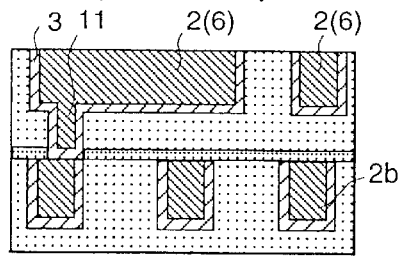
Figure 10D:
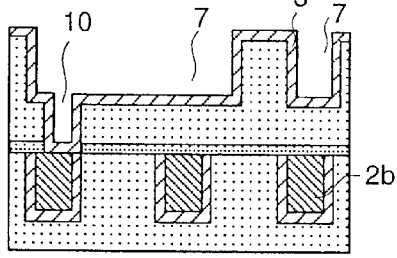
Figure 10H:
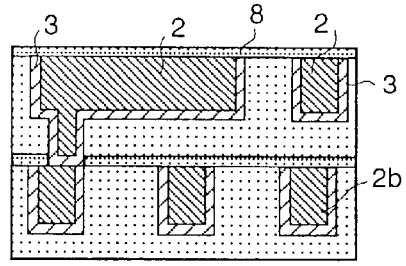
Figure 11:
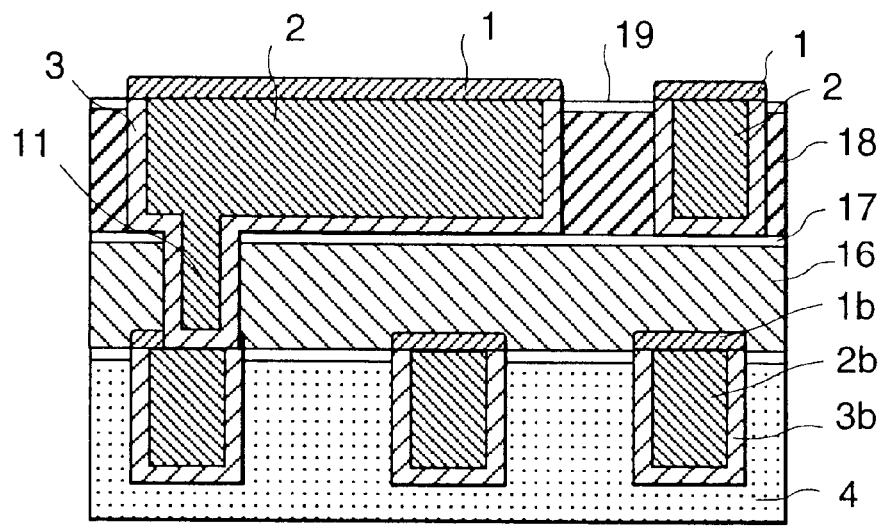
FIG. 11 is a cross sectional view showing another embodiment of the semiconductor device of the present invention.
Figure 12:
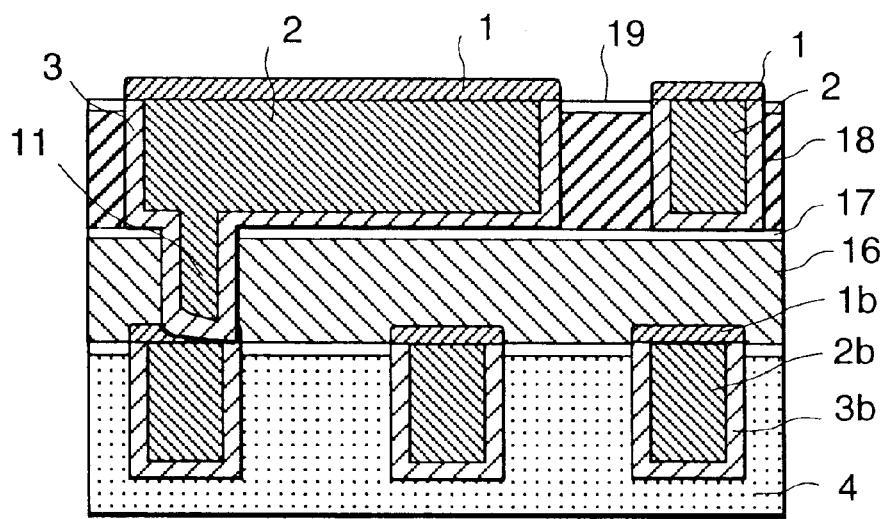
FIG. 12 is a cross sectional view showing an embodiment of the present invention.

To connect between the bottom of the connection hole 10 and the copper wiring 2b under it, the insulating wire protective film is removed according to conventional means (See FIG. 10(d). Further, if the wire protective film remains, a connection failure may occur according to the conventional means. If the conductive cobalt alloy film is used as protective film 1, electric connection can be ensured without removing the wire protective film 1. This facilitates etching connection in forming the connection hole 10, and improves the semiconductor device reliability. Furthermore, the cobalt alloy film has a higher resistance than copper. If the wire protective film 1 on the bottom of the connection hole 10 is removed at least partly, as shown in FIGS. 11 and 12, it is possible to reduce the resistance applied to the connection between the copper wiring 2b on the lower layer and copper wire 2, thereby improving the wiring system efficiency. More specifically, the cobalt alloy on the bottom of the connection hole 10 was dissolved and removed by immersion in 2 percent by weight of sulfuric acid liquid after wiring groove 7 and connection hole 10 had been formed, as shown in of FIG. 7(g). The copper wire on the upper layer was formed as in the case of the other embodiments, with the result that the electrical connection was established between the copper wire 2b on the lower layer and copper wire 2 through the barrier film 3, as shown in FIG. 11. This has succeeded in reducing the resistance applied to the wiring plug 11.

In the semiconductor device provided with copper wiring, a wire protective film covering the top of the copper wiring formed in the insulation film and a barrier film surrounding the side and bottom of the copper wiring are covered with cobalt alloy film containing (1) cobalt, (2) at least one of chromium, molybdenum, tungsten, rhenium, thallium and phosphor, and (3) boron. Then, oxidation and diffusion of copper as a wiring material can be prevented, thereby obtaining the copper wiring and other elements of high reliability. Further, a wire protective film can be formed without using palladium, with the result that the problem of increasing wiring resistance due to the presence of palladium can be avoided.

If said cobalt alloy film is used as a wire protective film, it is possible for the wire protective film to be formed only on the copper wiring on a selective basis. Also, if the barrier film is formed by said conductive cobalt alloy film, copper can be electrically plated directly on the barrier film without a power feed layer, thereby solving the problem of forming voids and eliminating the need for forming a seed layer.

What is claimed is:

1. A semiconductor device comprising:
    (1) multiple layers of copper wires formed in an insulation film,
    (2) a wire protective film covering the top of said copper wire, and
    (3) a barrier film surrounding the side and bottom of said copper wiring;
    said semiconductor device characterized in that at least one of said wiring protective film and the barrier film is formed of cobalt alloy film containing boron and at least one of chromium, molybdenum, tungsten, rhenium, thallium and phosphorous.

2. A semiconductor device according to claim 1 characterized in that
    multiple layers of copper wires are formed in the insulation film,
    a wiring protective film and barrier film are covered with cobalt alloy film containing (1) cobalt, (2) at least one of chromium, molybdenum, tungsten, rhenium, thallium and phosphorus, and (3) boron, and
    at least a part of the copper wire on the upper layer is electrically connected with the copper wire on the lower layer through said barrier layer.

3. A semiconductor device according to claim 1 or 2 characterized in that the insulating film has a dielectric constant of 3 or less.

4. A semiconductor device according to claim 1 or 2 characterized in that said cobalt alloy film has a preferred thickness of 100 nm or less, and contains
    50 to 95 atomic percent cobalt,
    1 to 40 atomic percent at least one of chromium, molybdenum, tungsten, rhenium, thallium and phosphorus, and
    0.1 to 10 atomic percent boron.

5. A semiconductor device according to claim 1 or 2 characterized in that
    multiple layers of copper wires are formed in the insulation film,
    wiring protective film and barrier film are covered with cobalt alloy film containing (1) cobalt, (2) at least one of chromium, molybdenum, tungsten, rhenium, thallium and phosphorus, and (3) boron, and the copper wire on the upper layer is electrically connected with the copper wire on the lower layer through said cobalt alloy.

6. A semiconductor device according to claim 1 or 2 characterized in that an insulation film, serving as an etch stop layer that stops etching on said insulation film, is further formed on the surface of said insulation film except where the wire protective film is formed.

7. A semiconductor device according to claim 1 or claim 2 characterized in that multiple layers of copper wires are formed in the insulation film, a wiring protective film and barrier film are covered with cobalt alloy film containing (1) cobalt, (2) at least one of chromium, molybdenum, tungsten, rhenium, thallium and phosphorus, and (3) boron, and at least a part of the copper wire on the upper layer is electrically connected with the copper wire on the lower layer through the barrier film.

8. A semiconductor device described in claim 1 through claim 7 characterized in that said cobalt alloy does not contain palladium.

9. A semiconductor device comprising:
    multiple layers of copper wires in an insulation film,
    a wire protective film on said copper wires, and
    a barrier film surrounding positions of said copper wiring, wherein at least one of said wiring protective film and the barrier film is formed of cobalt alloy film containing boron and at least one of chromium, molybdenum, tungsten, rhenium, thallium and phosphorous.

10. A semiconductor device according to claim 9, wherein said wiring protection film and said barrier film are covered with cobalt alloy film containing (1) cobalt, (2) at least one of chromium, molybdenum, tungsten, rhenium, thallium and phosphorous, and (3) boron, and
    at least a part of the copper wire on an upper layer is electrically connected with the copper wire on a lower layer through said barrier layer.

11. A semiconductor device according to claim 9, wherein the insulating film has a dielectric constant of 3 or less.

12. A semiconductor device according to claim 9, wherein said cobalt alloy film has a preferred thickness of 100 nm or less, and contains
    50 to 95 atomic percent cobalt,
    1 to 40 atomic percent at least one of chromium, molybdenum, tungsten, rhenium, thallium and phosphorous, and
    0.1 to 10 atomic percent boron.

13. A semiconductor device according to claim 9, wherein said wiring protective film and said barrier film are covered with cobalt alloy film containing (1) cobalt, (2) at least one of chromium, molybdenum, tungsten, rhenium, thallium and phosphorous, and (3) boron, and the copper wire on an upper layer is electrically connected with the copper wire on a lower layer through said cobalt alloy.

14. A semiconductor device according to claim 9, wherein an insulation film is provided as an etch stop layer that stops etching on said insulation film and is formed on the surface of said insulation film except where the wire protective film is formed.

15. A semiconductor device according to claim 10, wherein said cobalt alloy does not contain palladium.

* * * * *